United States Patent
Tsai

[19]

[11] Patent Number: 6,107,171
[45] Date of Patent: Aug. 22, 2000

[54] METHOD TO MANUFACTURE METAL GATE OF INTEGRATED CIRCUITS

[75] Inventor: Kwong-Jr Tsai, Kaohsiung, Taiwan

[73] Assignee: Vanguard International Semiconductor Corporation, Hsinchu, Taiwan

[21] Appl. No.: 09/113,974

[22] Filed: Jul. 9, 1998

[51] Int. Cl.[7] .............................................. H01L 21/3205
[52] U.S. Cl. .......................... 438/584; 438/595; 438/591; 438/588; 438/303
[58] Field of Search ................................. 438/299–307, 438/585–595, 584

[56] References Cited

U.S. PATENT DOCUMENTS

| | | | |
|---|---|---|---|
| 5,304,504 | 4/1994 | Wei et al. ................................. | 438/303 |
| 5,679,591 | 10/1997 | Lin et al. ................................. | 438/257 |
| 5,874,353 | 2/1999 | Lin et al. ................................. | 438/592 |
| 5,888,588 | 3/1999 | Nagabushnam et al. ............... | 438/655 |
| 5,897,349 | 4/1999 | Agnello ................................... | 438/230 |

*Primary Examiner*—Chandra Chaudhari
*Assistant Examiner*—Thanh Nguyen
*Attorney, Agent, or Firm*—Christensen O'Connor Johnson & Kindness PLLC

[57] ABSTRACT

The present invention discloses a method to manufacture metal gate of integrated circuits. A gate oxide layer is formed on a substrate and a polysilicon layer is then deposited on the gate oxide layer. Afterwards, a barrier layer is formed on the polysilicon layer and a metal layer is deposited on the barrier layer. An etching process is performed to etch the metal layer and the barrier layer, and a metal gate is defined. Then, silicon nitride liners are formed on the sidewalls of the metal gate. Finally, silicon nitride spacers are formed on the silicon nitride liners and on the sidewalls of the polysilicon gate to serve as an insulating layer.

20 Claims, 4 Drawing Sheets

METHOD TO MANUFACTURE METAL GATE OF INTEGRATED CIRCUITS

FIELD OF THE INVENTION

The present invention relates to a method for fabricating a metal gate of integrated circuits, and more specifically, to a method for fabricating a metal gate with silicon nitride spacers for integrated circuits.

BACKGROUND OF THE INVENTION

According to the trend for the development of integrated circuits, the integration of integrated circuits is increased as large as possible. Many techniques to shrink the dimension of devices are implemented to increase the density of the devices on a silicon wafer.

To reduce the dimension of devices is accompanied by many problems, such as short-channel effect. Besides, the contact resistance of the devices is increased. After the metallization process of the devices, the contact resistance between an active region and a metallic contact of a large-size device is lower than that of a small-size device. Simultaneously, the performance of the small-size devices will be degraded. Thus, a method to manufacture a gate, which is made of metal material, is proposed to reduce the contact resistance between the gate and the substrate and also the gate sheet resistance. In the following descriptions, a method for fabricating a metal gate is described.

Referring to FIG. 1, a substrate 100 is used to be a basis for integrated circuits. A gate oxide layer 110 is deposited on the substrate 100 and a polysilicon layer 120 is then deposited on the gate oxide layer 110. A barrier layer 130 and a metal layer 140 are sequentially deposited. At last, a silicon nitride layer 150 covers the metal layer 140.

As the metal layer 140 will react on the polysilicon layer 120 to form a silicide layer between the metal layer 140 and the polysilicon layer 120, a barrier layer 130 is used to prevent from the formation of the silicide layer. Besides, an ohmic contact is formed between the metal layer 140 and the polysilicon layer 120. Another reason for using the barrier layer is to prevent metal ions from diffusing into the gate oxide layer 110 during the following process for integrated circuits. If the gate oxide layer 110 is degraded, the devices could not be operated. As a lower resistance of the metal gate, a current can be easily transfer through the metal gate.

In memory devices, source/drain regions must be connect to metal contacts. The silicon nitride layer 150 on the metal layer 140 is served as a etching protective layer for a self-aligned contact process of the source/drain regions to protect the metal layer 140. The silicon nitride layer 150 is not needed for the process of all kinds of devices, for example, the process for fabricating logic circuits do not comprise the self-aligned contact stage. So, the silicon nitride layer 150 could be optionally deposited.

Referring to FIG. 2, the layers on the substrate are etched to define the metal gate of integrated circuits. A resistance pattern (not shown) is defined on the silicon nitride layer 150 by using lithography technology. Afterwards, the silicon nitride layer 150, the metal layer 140, the barrier layer 130, the polysilicon layer 120 and the gate oxide layer 110 are anisotropically etched by using a plasma etching process.

Referring to FIG. 3, after the definition of the metal gate, a silicon nitride layer is deposited to cover the surface of the gate and the substrate 100. A dry etching is performed to etch the silicon nitride layer and silicon nitride spacers are formed to on the sidewalls of the gate to serve as an insulating layer.

Metal gates exhibit a low sheet resistance. Nevertheless, oxidation or cleaning process is needed during the process, as is shown in FIG. 2. The process for forming lightly doped drains or a process, which is implemented in an oxygen ambient, will cause the devices failure. As the volume of the layers is changed after an oxidation process, a stress is induced in the metal gate so that the layers on the substrate peel off.

An issue about the metal gate is that the metal gate is etched or degraded by an acid solution or a base solution during cleaning processes. Thus, the metal gate must be protected so that a device with the metal gate has a high reliability.

SUMMARY OF THE INVENTION

A method for fabricating a metal gate of integrated circuits is disclosed in the present invention. A substrate is provided for the basis of integrated circuits. A gate oxide layer, a polysilicon layer, a barrier layer and a metal layer are sequentially deposited on the substrate. The metal layer and the barrier layer are etched to define the metal gate of integrated circuit. Then, liners is formed on sidewalls of the metal gate for protecting. Finally, the polysilicon layer and the gate oxide layer are etched. The polysilicon layer and the gate oxide layer under the barrier layer is used to be a contact layer between the metal gate and the substrate for the same work function with nominal polysilicon gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for fabricating a metal gate of integrated circuits. A barrier layer and a metal layer are sequentially deposited on the polysilicon gates of integrated circuits and the composite structures are metal gates of integrated circuits. Afterwards, a silicon nitride liners are formed on the sidewalls of the metal gates. The silicon nitride liners are indicated as an insulating layer and it protects the metal gates from degradation during oxidation or cleaning processes. Silicon nitride spacers are formed on the side-surface of the silicon nitride liners and the polysilicon gates. After the formation of the silicon nitride spacers, the metal gate structure is complete. The silicon nitride liners protect the metal gates of integrated circuits against an acid solution or a base solution.

Figure 1:
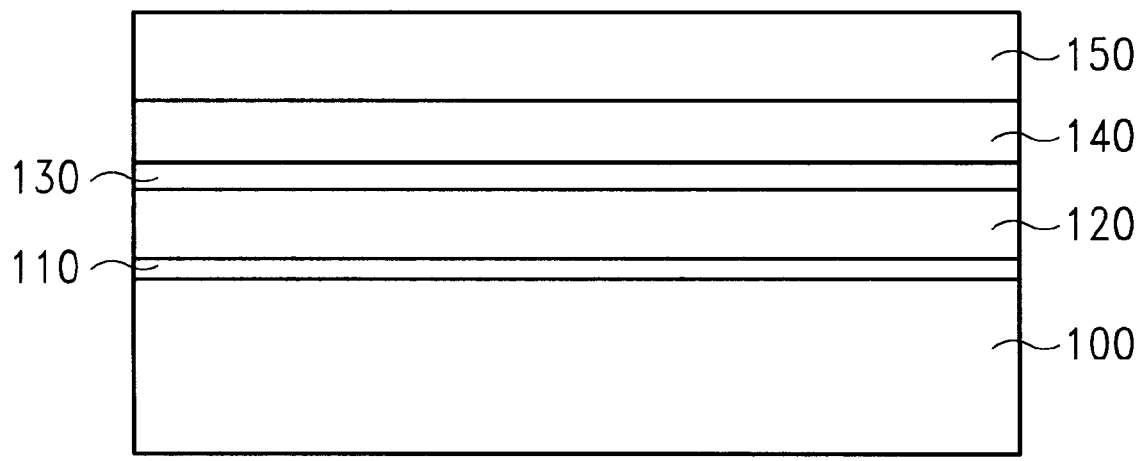
FIG. 1 is a schematic cross sectional view of a substrate in accordance with prior art, a gate oxide layer, a polysilicon layer, a barrier layer, a metal layer and a silicon nitride layer are deposited on the substrate.
Figure 2:
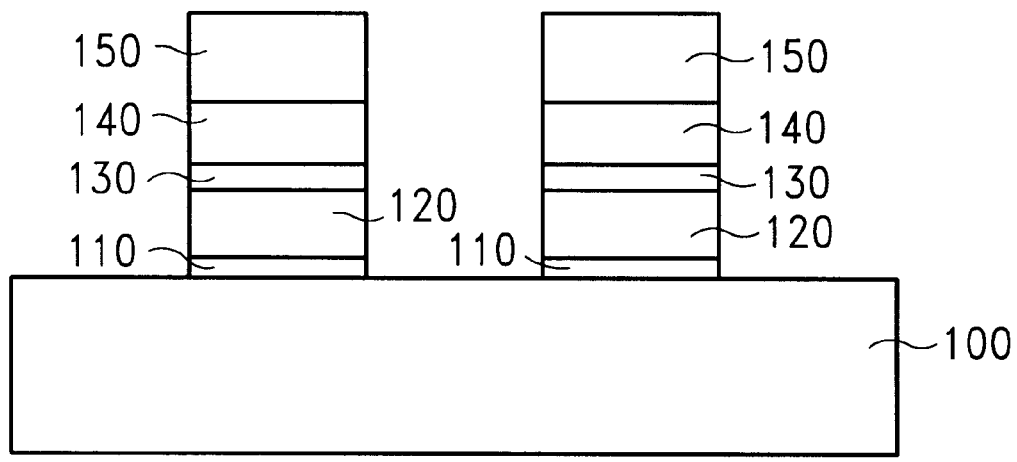
FIG. 2 is a schematic cross sectional view of the substrate in accordance with prior art, gate structures of integrated circuits is defined on the substrate.
Figure 3:
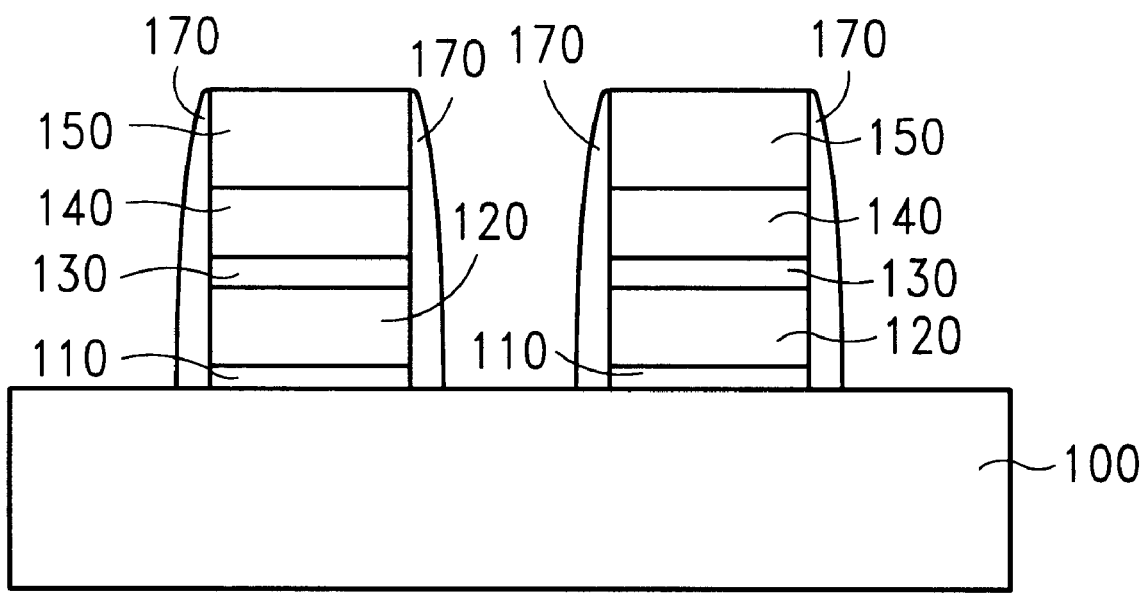
FIG. 3 is a schematic cross sectional view of the substrate in accordance with prior art, silicon nitride spacers are formed on the sidewalls of the metal gates to be an insulating layer for the gates.
Figure 4:
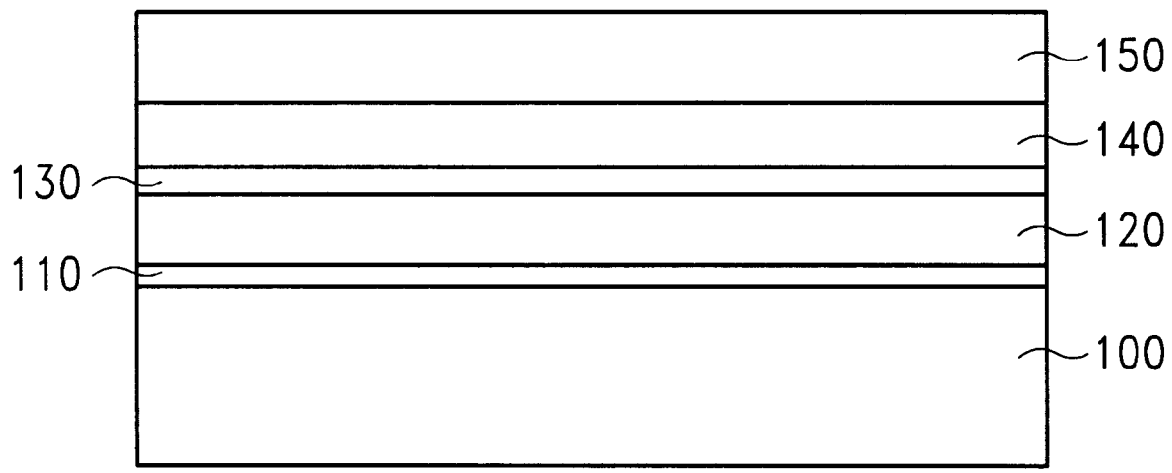
FIG. 4 is a schematic cross sectional view of the substrate in accordance with the present invention, a gate oxide layer, a polysilicon layer, a barrier layer, a metal layer and a silicon nitride layer are deposited on the substrate.

Referring to FIG. 4, a substrate 100 is provided and integrated circuits will be constructed on it. The substrate 100 is a semiconductor substrate with <100> crystal orientation. Firstly, a gate oxide layer 110 is formed on the surface of the substrate 100. As known in the art, the gate oxide layer 110 is formed by using a thermal oxidation process or a conventional chemical vapor deposition process. In a case, the thickness of the gate oxide layer 110 is between about 50 to 100 angstroms. Afterwards, a polysilicon layer 120 is deposited on the gate oxide layer 110 and a polysilicon gate consisting of the gate oxide layer 110 and the polysilicon layer 120 is formed. As skilled in the art, the method to deposit the polysilicon layer 120 is low pressure chemical vapor deposition (LPCVD) process and the polysilicon layer 120 has a thickness between about 1000 to 3000 angstroms.

Referring to FIG. 4 again, a barrier layer 130 is formed on the polysilicon layer 120 to be a contact layer between polysilicon material and metal material. By using the barrier layer 130, an ohmic contact can be formed between the polysilicon gate and a metal gate on the polysilicon gate. As skilled in the art, the barrier layer 130 is made of titanium nitride, tungsten titanium or tungsten nitride, and the technology for forming the barrier layer 130 is physical vapor deposition (PVD) process or chemical vapor deposition (CVD) process. In a case, the barrier layer 130 has a thickness between about 50 to 500 angstroms.

Still referring to FIG. 4, a metal layer 140 is formed on the barrier layer 130 by using physical vapor deposition (PVD) process and it is made of titanium silicide, tungsten or cobalt silicide. In a preferred embodiment, the metal layer 140 has a thickness between about 700 to 1500 angstroms.

Referring to FIG. 4 again, a silicon nitride layer 150 is formed to cover the surface of the metal layer 140. The silicon nitride layer 150 is used to be a protective layer of the metal gate and an etching mask for the metal gate during a self-aligned contact process. As skilled in the art, the silicon nitride layer 150 is deposited by using low pressure chemical vapor deposition (LPCVD) process. In a case, the thickness of the silicon nitride layer 150 is between about 2000 to 3000 angstroms. In the manufacturing of logic circuits, a self-aligned contact process for source/drain regions is not required. Thus, the metal gates of logic circuits do not need a protective layer and the silicon nitride layer 150 can be optionally deposited.

Figure 5:
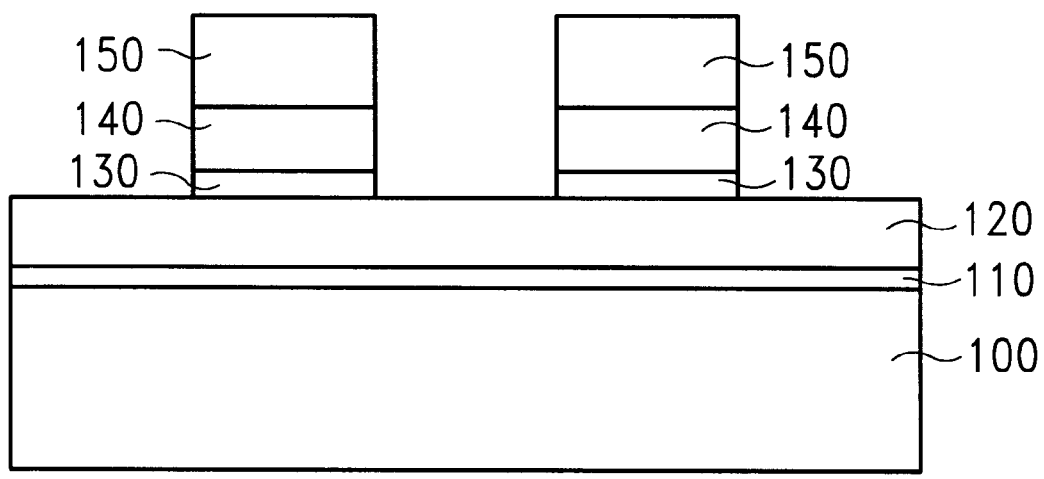
FIG. 5 is a schematic cross sectional view of the substrate in accordance with the present invention, the silicon nitride layer, the metal layer and the barrier layer are etched to form a metal gate on the polysilicon layer.

Referring to FIG. 5, the silicon nitride layer 150, the metal layer 140 and the barrier layer 130 are etched to define a metal gate on the polysilicon layer 120 by using an anisotropical etching process, such as a plasma etching process. Besides, the pattern of the metal gate is defined by using a conventional lithography technology.

Figure 6:
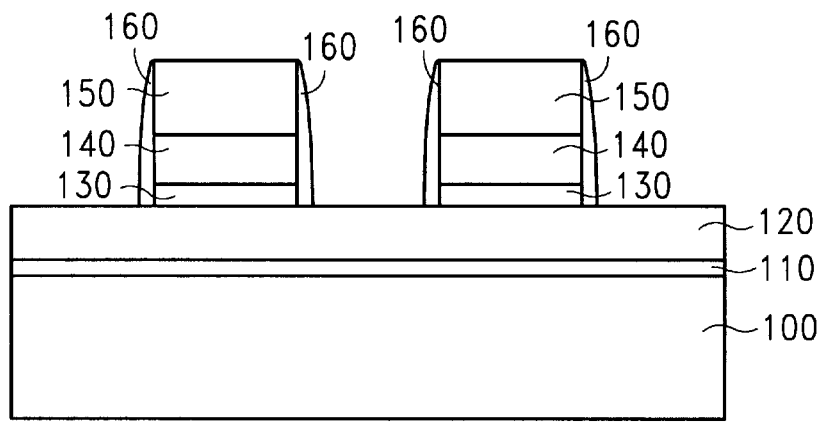
FIG. 6 is a schematic cross sectional view of the substrate in accordance with the present invention, silicon nitride liners are formed on the sidewalls of the metal gates to protect the metal gates from etching.

Referring to FIG. 6, silicon nitride liners 160 are formed on the sidewalls of the metal gate to protect the sidewalls of the silicon nitride layer 150, the metal layer 140 and the barrier layer 130. The formation of the silicon nitride liners 160 is to deposit a silicon nitride layer over the surface of the metal gate and to cover the substrate 100. In a preferred embodiment, the forgoing silicon nitride layer has a thickness between about 100 to 200 angstroms. Afterwards, the silicon nitride layer on the metal gate and on the substrate is removed and the silicon nitride layer on the sidewalls of the metal gate is remained to be the silicon nitride liners 160.

The silicon nitride liners 160 cover the sidewalls of the metal gate for protecting and the metal gate will not be degraded or etched during following oxidation and cleaning processes. In prior art, the silicon nitride liners 160 do not protect the metal gate; the metal gate and the polysilicon gate are simultaneously formed during an etching process. The metal gate is easy to be degraded. Consequently, the silicon nitride liners in the present invention could protect the metal gate from the forgoing problem in prior art.

Figure 7:
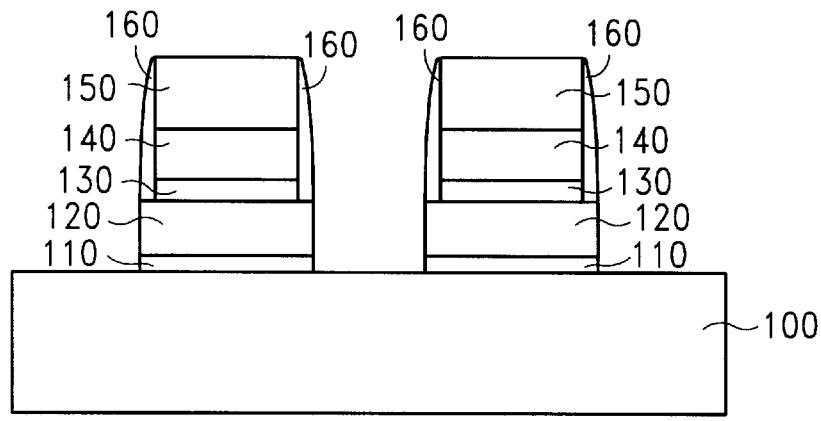
FIG. 7 is a schematic cross sectional view of the substrate in accordance with the present invention, the polysilicon layer and the gate oxide layer are etched and a polysilicon layer is formed between the metal gates and the substrate to be a contact layer.

Referring to FIG. 7, the polysilicon layer 120 and the gate oxide layer 110 are etched to define the structure of the polysilicon gate by using the silicon nitride layer 150 and the silicon nitride liners 160 to serve as an etching mask. In a preferred embodiment, a plasma etching technology is used for the etching process to define the polysilicon gate . Because the polysilicon material and the oxide material have a high etching selectivity to the silicon nitride material, the silicon nitride layer 150 and the silicon nitride liners 160 are served as an etching mask. A lithography process to define the pattern of the polysilicon gate is not required in the present invention.

Figure 8:
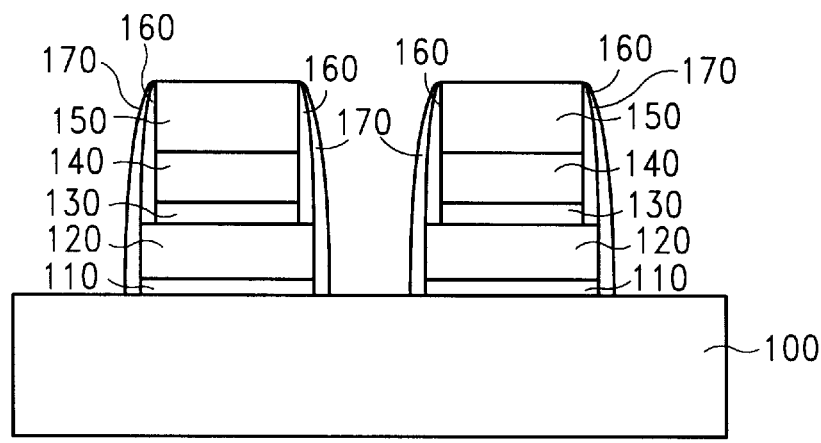
FIG. 8 is a schematic cross sectional view of the substrate in accordance with the present invention, the silicon nitride spacers cover on the sidewalls of the metal gates and the polysilicon gates.

Referring to FIG. 8, silicon nitride spacers 160 are formed on the sidewalls of the silicon nitride liners 160, and the polysilicon layer 120 and the gate oxide layer 110. The silicon nitride spacers 160 are indicated as a hard mask during the self-aligned contact process of source/drain regions. A self-aligned contact for the source/drain region is formed between the silicon nitride spacers 160. As skilled in the art, the deposition of the silicon nitride spacers 170 is to deposit a silicon nitride layer, which has a thickness between about 400 to 800 angstroms. An etching process is performed to remove the silicon nitride layer on the silicon nitride layer 150 and the substrate 100 and the silicon nitride spacers 170 is remained on the sidewalls of the gate structure.

The silicon nitride spacers 170 are indicated as a hard mask for the gate structure during the self-aligned contact process of source/drain regions. If integrated circuits do not comprise a self-aligned contact process, the spacers for the gate structure could not be made of silicon nitride material and it can be made of silicon oxide material for insulating.

After the manufacturing of the gate structure, the processes to fabricate active regions of integrated circuits and the metallic process are performed, and these processes are similar to that is used in prior art.

While the preferred embodiment of the invention has been illustrated and described, it will be appreciated that various changes can be made therein without departing from the spirit and scope of the invention.

What is claimed is:

1. A method for fabricating a metal gate of integrated circuits, comprising:

providing a substrate;

forming a gate oxide layer on said substrate;

forming a polysilicon layer on said gate oxide layer;

forming a barrier layer on said polysilicon layer;

forming a metal layer on said barrier layer;

etching only said metal layer and said barrier layer to define said metal gate on said barrier layer;

forming a liner on sidewalls of said metal gate to protect said metal layer and said barrier layer; and then etching said polysilicon layer and said gate oxide layer, wherein said polysilicon layer and said gate oxide layer under said barrier layer is remained to be a polysilicon gate, wherein said polysilicon gate being a contact layer between said metal gate and said substrate.

2. The method of claim 1, wherein said barrier layer is selected from a group consisting of titanium nitride, titanium tungsten and tungsten nitride.

3. The method of claim 1, wherein said barrier layer has a thickness between about 100 to 500 angstroms.

4. The method of claim 1, wherein said metal layer is selected from a group consisting of titanium silicide, tungsten and cobalt silicide.

5. The method of claim 1, wherein said metal layer has a thickness between about 700 to 1500 angstroms.

6. The method of claim 1, wherein said metal layer and said barrier layer are etched by using a plasma etching process.

7. The method of claim 1, wherein said liners have a thickness between about 100 to 200 angstroms.

8. The method of claim 1, wherein said liners comprise silicon nitride material.

9. The method of claim 1, wherein said polysilicon layer and said gate oxide layer are etched by using said metal layer and said liners as a etching mask to define a pattern of said polysilicon gate.

10. The method of claim 1, wherein said polysilicon layer and said gate oxide layer are etched by using a plasma etching process.

11. A method for fabricating a metal gate of integrated circuits, comprising:

providing a substrate;

forming a gate oxide layer on said substrate;

forming a polysilicon layer on said gate oxide layer;

forming a barrier layer on said polysilicon layer;

forming a metal layer on said barrier layer;

forming a silicon nitride layer on said metal layer;

etching only said nitride layer, said metal layer and said barrier layer to define said metal gate;

forming liners on sidewalls of said metal gate to protect said silicon nitride layer, said metal layer and said barrier layer;

etching said polysilicon layer and said gate oxide layer, and said polysilicon layer and said gate oxide layer under said barrier layer being remained to be a polysilicon gate, wherein said polysilicon gate is used to be a contact layer between said substrate and said metal gate; and forming spacers on sidewalls of said liners, said polysilicon layer and said gate oxide layer.

12. The method of claim 11, wherein said barrier layer is selected from a group consisting of titanium silicide, titanium tungsten and tungsten nitride.

13. The method of claim 11, wherein said barrier layer has a thickness between about 100 to 500 angstroms.

14. The method of claim 11, wherein said metal layer is selected from a group consisting of titanium silicide, tungsten and cobalt silicide.

15. The method of claim 11, wherein said metal layer has a thickness between about 700 to 1500 angstroms.

16. The method of claim 11, wherein said silicon nitride layer has a thickness between about 2000 to 3000 angstroms.

17. The method of claim 11, wherein said silicon nitride layer, said metal layer and said barrier layer are etched by using a plasma etching process.

18. The method of claim 11, wherein said liners comprise silicon nitride material.

19. The method of claim 11, wherein said polysilicon layer and said gate oxide layer are etched by using said silicon nitride spacers and said silicon nitride liners to serve an etching mask to define said polysilicon gate.

20. The method of claim 11, wherein said spacers comprises silicon nitride material.

* * * * *

UNITED STATES PATENT AND TRADEMARK OFFICE
CERTIFICATE OF CORRECTION

PATENT NO. : 6,107,171
DATED : August 22, 2000
INVENTOR(S) : K.-J. Tsai

It is certified that error appears in the above-identified patent and that said Letters Patent is hereby corrected as shown below:

| COLUMN | LINE | |
|---|---|---|
| 5 (Claim 1, | 7 line 11) | "layer; and then" should read --layer; and-- |
| 6 (Claim 20, | 38-39 lines 1-2) | "com-prises" should read --com-prise-- |

Signed and Sealed this

First Day of May, 2001

Attest:

NICHOLAS P. GODICI

Attesting Officer     Acting Director of the United States Patent and Trademark Office